(12) United States Patent
Kelly et al.

(10) Patent No.: US 8,435,887 B2
(45) Date of Patent: May 7, 2013

(54) COPPER INTERCONNECT FORMATION

(75) Inventors: James J. Kelly, Schenectady, NY (US); Takeshi Nogami, Schenectady, NY (US); Kazumichi Tsumura, Kawasaki (JP)

(73) Assignees: International Business Machines Corporation, Armonk, NY (US); Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 13/151,658

(22) Filed: Jun. 2, 2011

(65) Prior Publication Data

US 2012/0309190 A1  Dec. 6, 2012

(51) Int. Cl.
*H01L 21/288* (2006.01)

(52) U.S. Cl.
USPC ..... 438/653; 438/652; 438/687; 257/E21.174

(58) Field of Classification Search .................. 438/652, 438/653, 687; 257/E21.174
See application file for complete search history.

(56) References Cited

U.S. PATENT DOCUMENTS

| | | | |
|---|---|---|---|
| 6,498,093 B1* | 12/2002 | Achuthan et al. | 438/643 |
| 6,624,070 B2* | 9/2003 | Merricks et al. | 438/678 |
| 7,585,762 B2* | 9/2009 | Shah et al. | 438/627 |
| 7,629,252 B2* | 12/2009 | O'Brien et al. | 438/641 |
| 7,851,357 B2* | 12/2010 | Cabral et al. | 438/637 |
| 8,089,154 B2* | 1/2012 | Sekiguchi et al. | 257/751 |
| 8,110,497 B2* | 2/2012 | Sakata et al. | 438/638 |
| 8,138,084 B2* | 3/2012 | Akolkar | 438/653 |
| 2005/0006245 A1* | 1/2005 | Sun et al. | 205/291 |
| 2006/0063375 A1* | 3/2006 | Sun et al. | 438/629 |
| 2006/0070885 A1* | 4/2006 | Uzoh et al. | 205/122 |
| 2007/0125657 A1* | 6/2007 | Sun et al. | 205/205 |
| 2007/0148852 A1* | 6/2007 | Lee | 438/216 |
| 2008/0113508 A1* | 5/2008 | Akolkar et al. | 438/687 |
| 2008/0237029 A1* | 10/2008 | Tang et al. | 204/164 |
| 2010/0038783 A1* | 2/2010 | Yang et al. | 257/751 |
| 2010/0167529 A1* | 7/2010 | Sakata et al. | 438/652 |
| 2011/0006427 A1* | 1/2011 | Sekiguchi et al. | 257/751 |

* cited by examiner

*Primary Examiner* — Alexander Ghyka
*Assistant Examiner* — Stanetta Isaac
(74) *Attorney, Agent, or Firm* — Yuanmin Cai; Ira D. Blecker

(57) ABSTRACT

Disclosed is a method which includes forming a copper interconnect within a trench or via in a substrate. Forming the copper interconnect includes forming a ruthenium-containing seed layer on a wall of the trench or via; forming a cobalt sacrificial layer on the ruthenium-containing layer before the ruthenium-containing seed layer being exposed to an environment that is oxidizing with respect to the seed layer; and contacting the cobalt sacrificial layer with a copper plating solution, the copper plating solution dissolving the cobalt sacrificial layer and plating out copper on the unoxidized ruthenium-containing seed layer. Alternatively, the ruthenium-containing seed layer may be replaced with platinum, tungsten nitride, titanium nitride or titanium or iridium. Further alternatively, the cobalt sacrificial layer may be replaced by tin, cadmium, copper or manganese.

14 Claims, 4 Drawing Sheets

US 8,435,887 B2

COPPER INTERCONNECT FORMATION

BACKGROUND

The exemplary embodiments relate to the formation of copper interconnects in semiconductor devices and, more particularly, relate to the formation of copper interconnects in semiconductor devices by the use of a sacrificial layer to protect an underlying seed layer.

As the size of semiconductor devices shrink, it becomes more difficult to fill the trench/via gaps with copper by electroplating of copper in the damascene copper interconnect formation process. In order to improve the copper gap filling performance by electroplating, a seed enhancement layer may be applied underneath the copper seed layer. As the semiconductor device dimension becomes smaller and smaller, the use of a copper seed layer on top of the seed enhancement layer may no longer be possible because of the pinch off of the copper seed layer at the entrance of the trench/via. This pinch off makes it difficult to fill the gap with copper without voids in the features by copper electroplating.

BRIEF SUMMARY

The various advantages and purposes of the exemplary embodiments as described above and hereafter are achieved by providing, according to a first aspect of the exemplary embodiments, a method of forming a copper interconnect. The method includes forming a ruthenium-containing seed layer on a substrate; forming a cobalt sacrificial layer on the ruthenium-containing layer before the ruthenium-containing seed layer being exposed to an environment that is oxidizing with respect to the ruthenium-containing seed layer; and contacting the cobalt sacrificial layer with a copper plating solution, the copper plating solution dissolving the cobalt sacrificial layer and plating out copper on the ruthenium-containing seed layer.

According to a second aspect of the exemplary embodiments, there is provided a method of forming a copper interconnect. The method includes forming a copper interconnect within a trench or via in a substrate. Forming the copper interconnect includes forming a ruthenium-containing seed layer on a wall of the trench or via; forming a cobalt sacrificial layer on the ruthenium-containing layer before the ruthenium-containing seed layer being exposed to an environment that is oxidizing with respect to the ruthenium-containing seed layer; and contacting the cobalt sacrificial layer with a copper plating solution, the copper plating solution dissolving the cobalt sacrificial layer and plating out copper on the ruthenium-containing seed layer to fill the trench or via.

According to a third aspect of the exemplary embodiments, there is provided a method of forming a copper interconnect. The method includes forming a copper interconnect within a trench or via in a substrate. Forming the copper interconnect includes forming a seed layer on a wall of the trench or via, the seed layer selected from the group consisting of platinum, tungsten nitride, titanium nitride, titanium, iridium, ruthenium phosphorus alloy, ruthenium tungsten alloy and tantalum ruthenium alloy; forming a sacrificial layer on the seed layer, the sacrificial layer selected from the group consisting of cobalt, tin, cadmium, copper and manganese; and contacting the sacrificial layer with a copper plating solution, the copper plating solution dissolving the sacrificial layer and plating out copper on the seed layer to fill the trench or via.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 2A to 2C illustrate cross-sectional views of a first exemplary embodiment of forming a copper interconnect in the semiconductor substrate of FIG. 1 wherein:

FIG. 2A illustrates depositing a ruthenium-containing seed layer;

FIG. 2B illustrates depositing a cobalt sacrificial layer; and

FIG. 2C illustrates the copper interconnect after the electroplating of copper to dissolve the cobalt sacrificial layer.

FIGS. 3A to 3D illustrate cross-sectional views of a second exemplary embodiment of forming a copper interconnect in the semiconductor substrate of FIG. 1 wherein:

FIG. 3A illustrates depositing a ruthenium-containing seed layer;

FIG. 3B illustrates depositing a cobalt sacrificial layer;

FIG. 3C illustrates depositing a copper seed layer; and

FIG. 3D illustrates the copper interconnect after the electroplating of copper to dissolve the copper seed layer and cobalt sacrificial layer.

FIGS. 4A to 4D illustrate cross-sectional views of a third exemplary embodiment of forming a copper interconnect in the semiconductor substrate of FIG. 1 wherein:

FIG. 4A illustrates depositing a barrier layer;

FIG. 4B illustrates depositing a ruthenium-containing seed layer;

FIG. 4C illustrates depositing a cobalt sacrificial layer; and

FIG. 4D illustrates the copper interconnect after the electroplating of copper to dissolve the cobalt sacrificial layer.

DETAILED DESCRIPTION

There has been proposed a new scheme, "Direct Plating", in which no copper seed layer is formed on top of the seed enhancement layer, but a seed enhancement layer such as ruthenium and cobalt itself works as the seed layer for copper plating. However, such direct plating schemes have problems. The problems depend on the materials such as ruthenium and cobalt when they are used as the seed layer for plating in the direct plating scheme. In the case of ruthenium as the seed layer, the problem is that the ruthenium surface oxidizes in the air after being deposited in a vacuum system for ruthenium thin film formation such as PVD and CVD. Such native oxide of ruthenium does not dissolve in the electroplating electrolyte solutions, but remains on top of the ruthenium film surface during and after plating. The resultant interface of ruthenium and copper includes the oxidized ruthenium. Since the nucleation of plated copper on such a ruthenium oxide is poor, this ruthenium-oxide layer causes the local voiding of copper and the inferior reliability performance during stress migration and electromigration testing. In the case of cobalt as the seed layer, the problem comes from the fact that the cobalt layer, which also grows a native oxide layer in the air after its deposition in a vacuum system, is not stable in the Cu plating bath due to the rapid dissolution of this native Co oxide. Since the thickness of the oxidation of the cobalt can be up to a few nanometers within a few hours, the cobalt layer becomes too thin to work as a robust local seed layer.

Accordingly, the present inventors have proposed a sacrificial layer over a seed layer. The seed layer is deposited so as to most preferably not be oxidized. The sacrificial layer protects the seed layer from being exposed to an environment during processing that is oxidizing with respect to the seed layer and dissolves in the plating bath during the plating of the copper.

Figure 1:
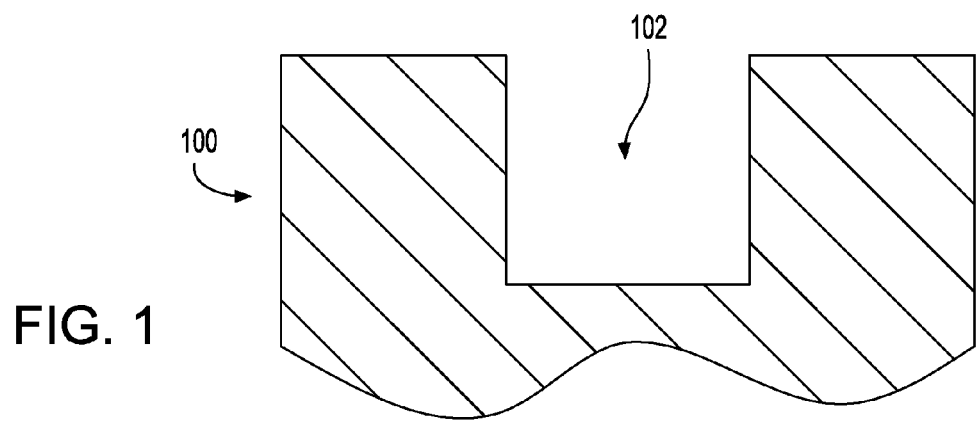
FIG. 1 illustrates a cross-sectional view of a semiconductor substrate having a trench or via opening which is to be filled with a copper interconnect.

Referring to the Figures in more detail, and particularly referring to FIG. 1, there is disclosed a semiconductor substrate 100 having a trench or via opening 102. The opening may be in the back of the line wiring layers of the semiconductor substrate 100 which are not shown for clarity. The various semiconductor devices previously formed in the semiconductor substrate 100 during front end of the line operations are also not shown for clarity. It is necessary to fill opening 102 with copper to form a copper interconnect.

The trench or via opening 102 in present day semiconductor technology may have a cross sectional dimension of about 30 nanometers and due to its small size may be prone to pinch off during deposition of the various layers. The size of trench or via opening 102 is exaggerated for clarity in showing the deposition of the various layers of the exemplary embodiments.

Figure 2A:
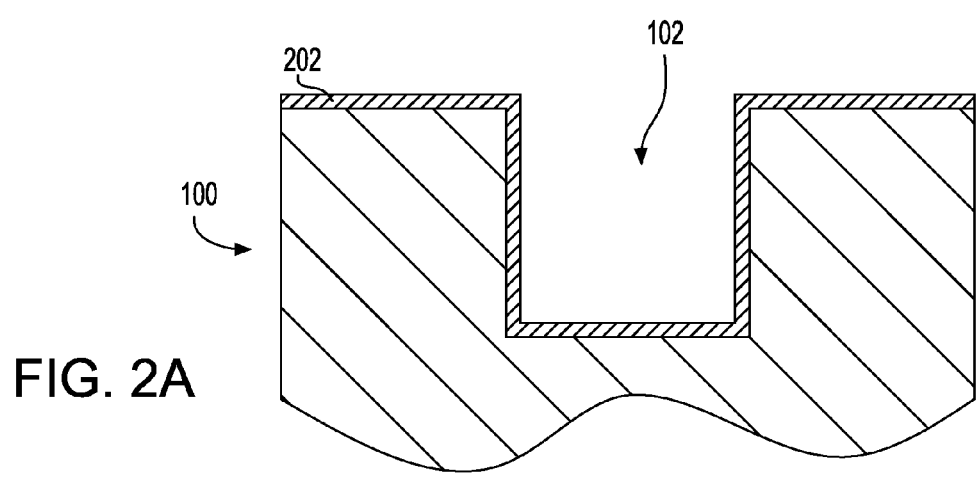
Figure 2B:
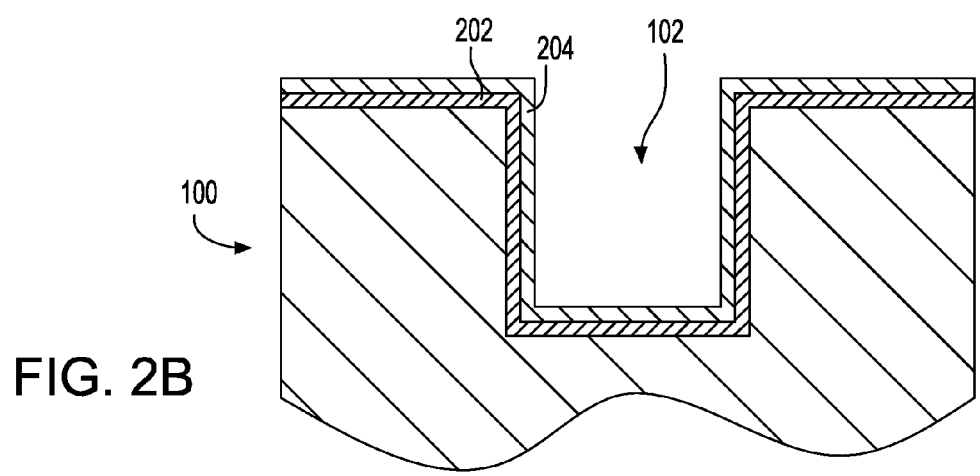
Figure 2C:
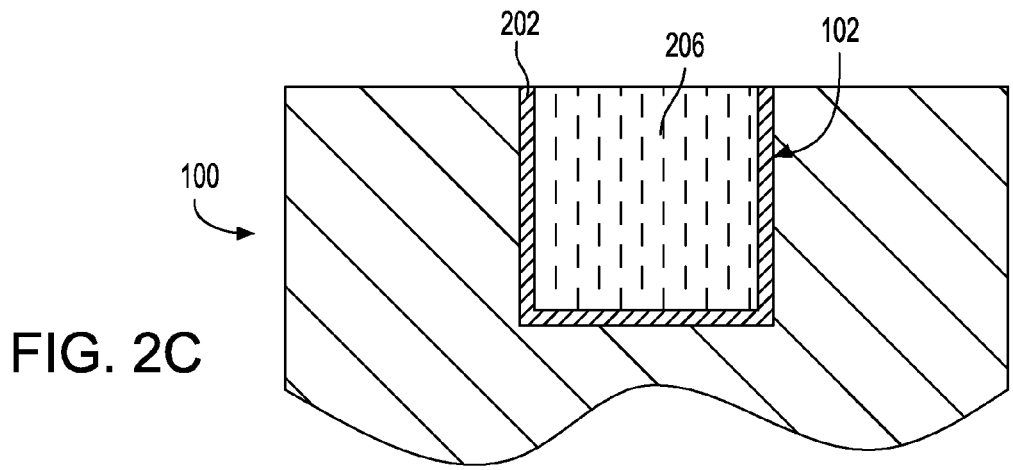

FIGS. 2A to 2C illustrate a first exemplary embodiment. Referring first to FIG. 2A, a ruthenium-containing seed layer 202 having a predetermined thickness is formed within opening 102 of semiconductor substrate 100. The ruthenium-containing seed layer 202 may be ruthenium, ruthenium tantalum alloy, ruthenium phosphorus alloy or ruthenium tungsten alloy. The ruthenium tantalum alloy may have a composition of about ruthenium 90 a/o (atomic percent) and tantalum 10 a/o. The ruthenium phosphorus alloy and ruthenium tungsten alloy may have a composition of about ruthenium 70-90 a/o, remainder phosphorus or tungsten, respectively.

It should be noted that if ruthenium is the ruthenium-containing seed layer 202, it may be desirable to have a barrier layer underneath the ruthenium as discussed in the third exemplary embodiment.

In FIG. 2B, a cobalt sacrificial layer 204 having a predetermined thickness is formed on the ruthenium-containing seed layer 202. The cobalt sacrificial layer 204 protects the ruthenium-containing seed layer 202 from being exposed to an environment that is oxidizing with respect to the seed layer 202. The cobalt precursor that is used does not contain any oxygen. One such suitable cobalt precursor is cobalt amidinate. No oxygen-containing gases are used with the cobalt precursor. In this manner, the cobalt sacrificial layer 204 may be formed without the ruthenium containing seed layer 202 becoming oxidized as a result of forming the cobalt sacrificial layer 204.

The substrate 100 is then immersed in a conventional copper electroplating solution which may contain, for example, sulfuric acid ($H_2SO_4$) and copper sulfate ($CuSO_4$) plus other additives. The cobalt sacrificial layer 204 is soluble in the copper electroplating solution which leaves a pristine ruthenium-containing surface for electroplating of the copper. Shown in FIG. 2C is the ruthenium-containing layer 202 with the copper 206 plated directly onto it. The copper 206 fills the opening 102. The cobalt sacrificial layer 204 has been dissolved in the copper plating solution and no longer is a part of semiconductor substrate 100.

Figure 3A:
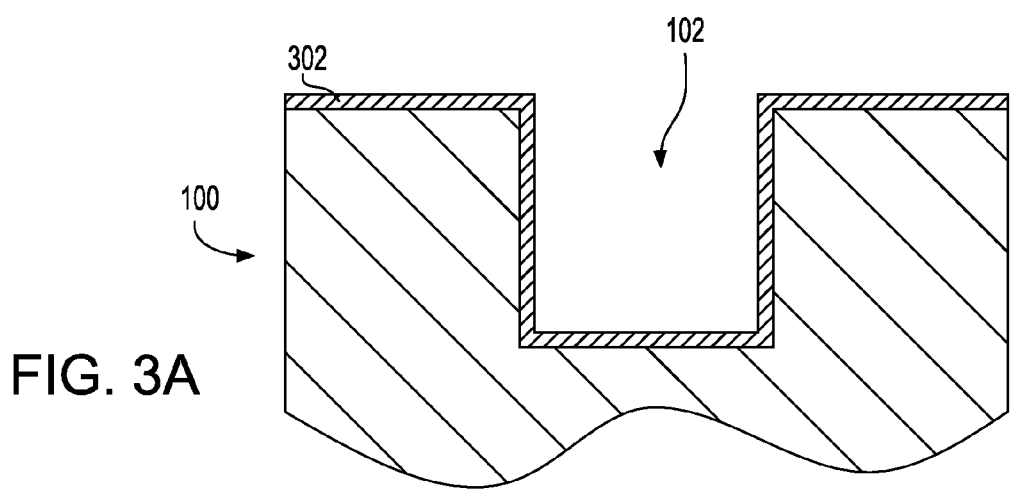

FIGS. 3A to 3D illustrate a second exemplary embodiment. Referring first to FIG. 3A, a ruthenium-containing seed layer 302 having a predetermined thickness is formed within opening 102 of semiconductor substrate 100. The ruthenium-containing seed layer 302 may be ruthenium, ruthenium tantalum alloy, ruthenium phosphorus alloy and ruthenium tungsten alloy as in the first exemplary embodiment.

It should be noted that in this second embodiment also, if ruthenium is the ruthenium-containing seed layer 302, it may be desirable to have a barrier layer underneath the ruthenium as discussed in the third exemplary embodiment.

Figure 3B:
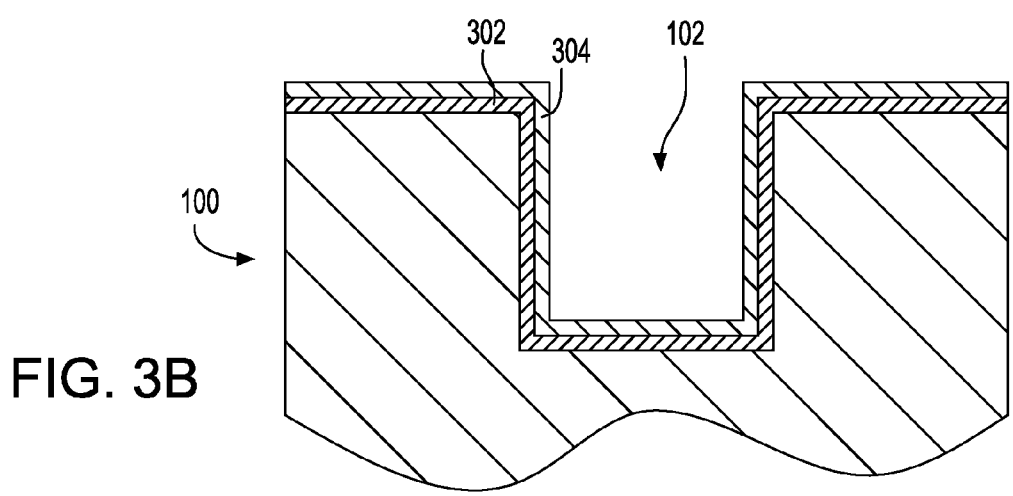

In FIG. 3B, a cobalt sacrificial layer 304 having a predetermined thickness is formed on the ruthenium-containing seed layer 302. The cobalt sacrificial layer 304 protects the ruthenium-containing seed layer 302 from being exposed to an environment that is oxidizing with respect to the seed layer 302.

Figure 3C:
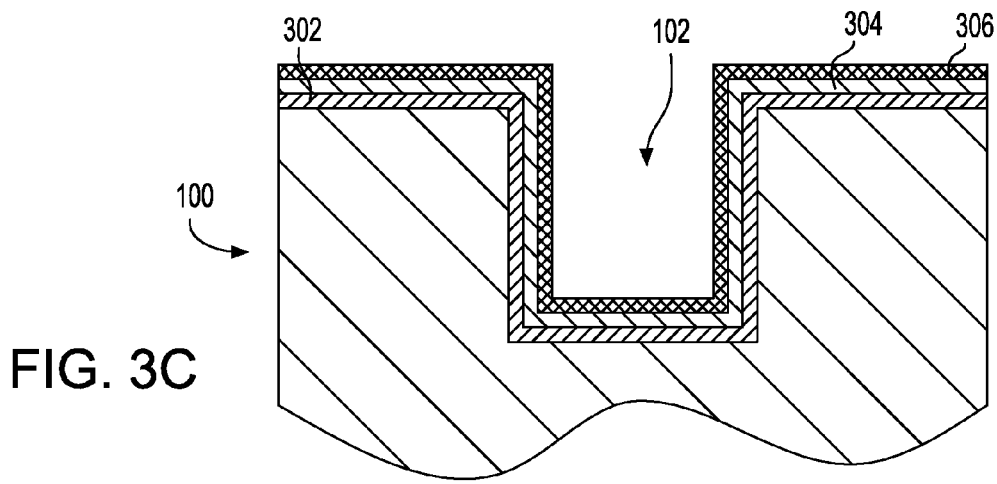

Referring now to FIG. 3C, this second exemplary embodiment includes an optional copper seed layer 306 having a predetermined thickness.

The substrate 100 is then immersed in a conventional copper electroplating solution, for example, as previously described. The cobalt sacrificial layer 304 and copper seed layer 306 are soluble in the copper electroplating solution which leaves a pristine ruthenium-containing surface for electroplating of the copper.

Figure 3D:
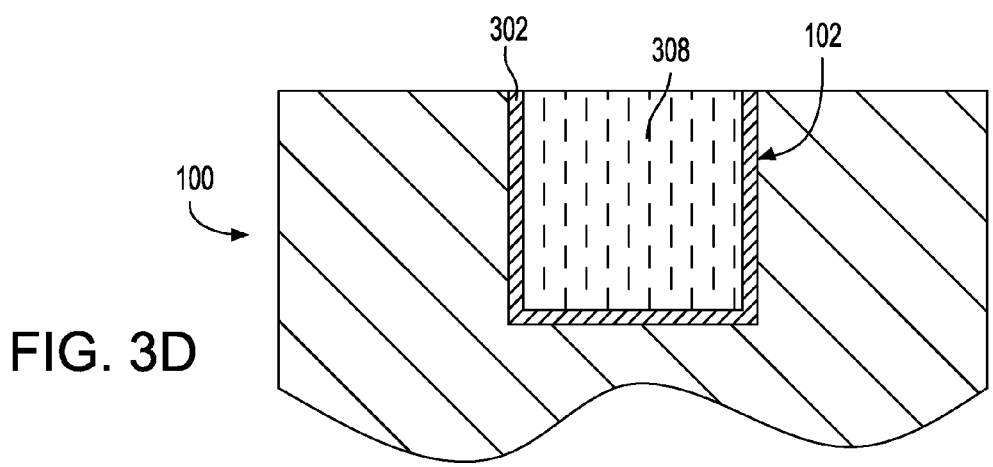

Shown in FIG. 3D is the ruthenium-containing layer 302 with the copper 308 plated directly onto it. The copper 308 fills the opening 102. The cobalt sacrificial layer 304 and copper seed layer 306 have been dissolved in the copper plating solution and no longer are a part of semiconductor substrate 100.

Figure 4A:
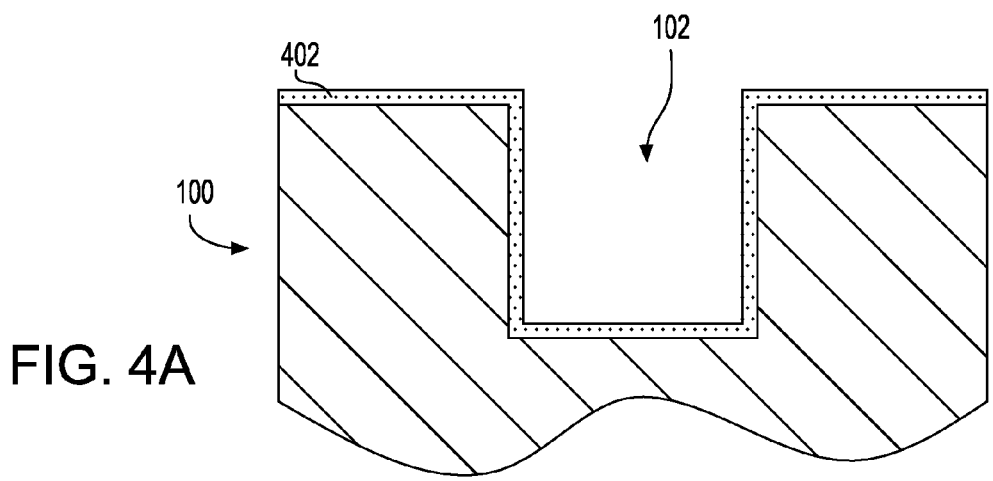

FIGS. 4A to 4D illustrate a third exemplary embodiment. When ruthenium is the ruthenium-containing layer referred to in the previous exemplary embodiments, there may be a barrier layer underneath the ruthenium since ruthenium may be an insufficient barrier to copper and oxygen. The barrier layer may be tantalum or tantalum nitride. Referring first to FIG. 4A, barrier layer 402, for example tantalum or tantalum nitride, having a predetermined thickness is deposited.

Figure 4B:
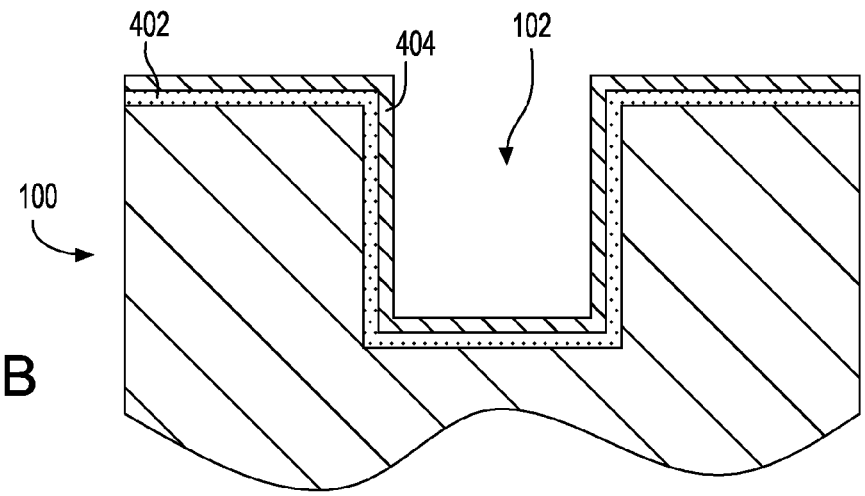

As shown in FIG. 4B, a ruthenium seed layer 404 having a predetermined thickness is formed on barrier layer 402 and within opening 102 of semiconductor substrate 100.

Figure 4C:
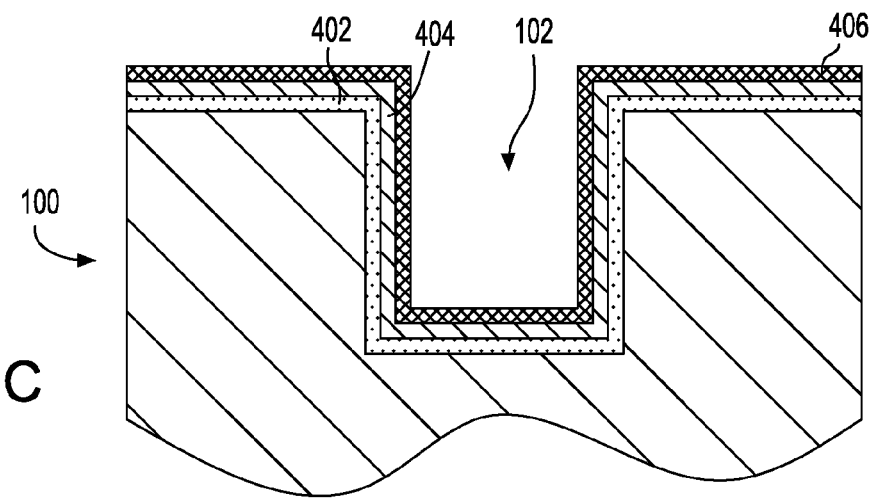

In FIG. 4C, a cobalt sacrificial layer 406 having a predetermined thickness is formed on the ruthenium seed layer 404. The cobalt sacrificial layer 406 protects the ruthenium layer 404 from being exposed to an environment that is oxidizing with respect to the ruthenium seed layer 404.

If desired, an optional copper seed layer (not shown) having a predetermined thickness may be deposited on the cobalt sacrificial layer 406.

Figure 4D:
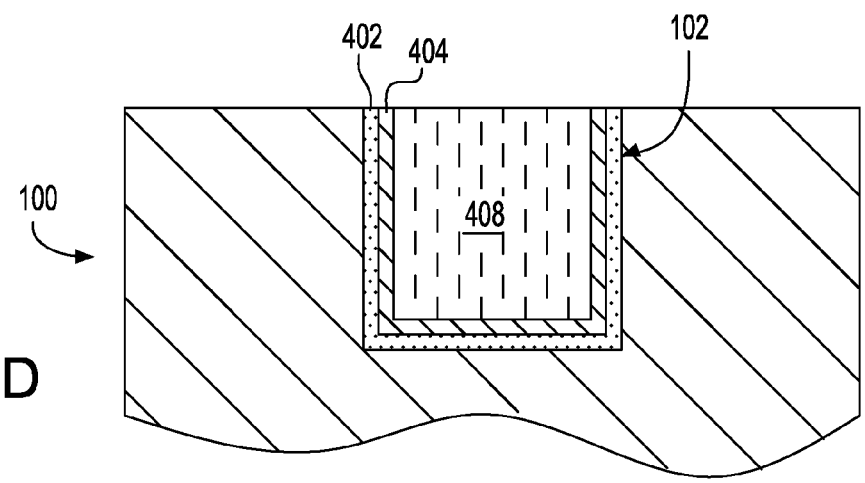

The substrate 100 is then immersed in a conventional copper electroplating solution, for example, as previously described. The cobalt sacrificial layer 406 is soluble in the copper electroplating solution which leaves a pristine ruthenium surface for electroplating of the copper. Shown in FIG. 4D is the barrier layer 402 and ruthenium seed layer 404 with the copper 408 plated directly onto the ruthenium layer 404. The copper 408 fills the opening 102. The cobalt sacrificial layer 406 has been dissolved in the copper plating solution and no longer is a part of semiconductor substrate 100.

In other exemplary embodiments, the ruthenium-containing seed layer may alternatively be replaced with platinum, tungsten nitride, titanium nitride or titanium or iridium. With these alternative seed layers, a barrier layer is not needed.

In further exemplary embodiments, the cobalt sacrificial layer may be replaced by tin, cadmium, copper or manganese.

The various layers may be deposited by chemical vapor deposition (CVD), physical vapor deposition (PVD) or atomic layer deposition (ALD). After the electroplating of the copper, a chemical-mechanical polishing (CMP) process may be performed to planarize the semiconductor substrate 100 to result in the structures shown in FIG. 2C, FIG. 3D and FIG. 4D.

In the foregoing exemplary embodiments, the layers may have the following predetermined thicknesses. The tantalum nitride or tantalum barrier layer may have a predetermined thickness of about 1 to 3 nanometers. The ruthenium-containing layer may have a predetermined thickness of about 1 to 3 nanometers. The cobalt sacrificial layer may have a predetermined thickness of about 1 to 3 nanometers. The copper seed layer, if one is present, may have a predetermined thickness of about 1 nanometer. In the exemplary embodiments where there is a platinum, tungsten nitride, titanium nitride or titanium or iridium seed layer, the predetermined thickness of the seed layer may be about 1 to 3 nanometers and where there is a tin, cadmium, copper or manganese sacrificial layer, the predetermined thickness of the sacrificial layer may also be about 1 to 3 nanometers.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of forming a copper interconnect comprising:
   forming a ruthenium-containing seed layer on a substrate;
   forming a cobalt sacrificial layer on the ruthenium-containing seed layer before the ruthenium-containing seed layer being exposed to an environment that is oxidizing with respect to the ruthenium-containing seed layer; and
   contacting the cobalt sacrificial layer with a copper plating solution, the copper plating solution dissolving the cobalt sacrificial layer and plating out copper on the unoxidized ruthenium-containing seed layer.

2. The method of claim 1 wherein the ruthenium-containing seed layer is selected from the group consisting of ruthenium, ruthenium tantalum alloy, ruthenium phosphorus alloy and ruthenium tungsten alloy.

3. The method of claim 2 wherein the ruthenium tantalum alloy comprises 90 atomic percent ruthenium and 10 atomic percent tantalum.

4. The method of claim 2 wherein the ruthenium phosphorus alloy comprises 70 to 90 atomic percent ruthenium and 30 to 10 atomic percent phosphorus and wherein the ruthenium tungsten alloy comprises 70 to 90 atomic percent ruthenium and 30 to 10 atomic percent tungsten.

5. The method of claim 1 further comprising forming a barrier layer on the substrate prior to forming a ruthenium-containing seed layer and wherein the ruthenium-containing seed layer is ruthenium and the ruthenium is formed on the barrier layer.

6. The method of claim 5 wherein the barrier layer is selected from the group consisting of tantalum and tantalum nitride.

7. The method of claim 1 further comprising forming a copper seed layer on the cobalt sacrificial layer and during the step of contacting, the copper plating solution dissolving the copper seed layer.

8. A method of forming a copper interconnect comprising:
   forming a copper interconnect within a trench or via in a substrate, wherein forming the copper interconnect comprising:
   forming a ruthenium-containing seed layer on a wall of the trench or via;
   forming a cobalt sacrificial layer on the ruthenium-containing seed layer before the ruthenium-containing seed layer being exposed to an environment that is oxidizing with respect to the ruthenium-containing seed layer; and
   contacting the cobalt sacrificial layer with a copper plating solution, the copper plating solution dissolving the cobalt sacrificial layer and plating out copper on the unoxidized ruthenium-containing seed layer to fill the trench or via.

9. The method of claim 8 wherein the ruthenium-containing seed layer is selected from the group consisting of ruthenium, ruthenium tantalum alloy, ruthenium phosphorus alloy and ruthenium tungsten alloy.

10. The method of claim 9 wherein the ruthenium tantalum alloy comprises 90 atomic percent ruthenium and 10 atomic percent tantalum.

11. The method of claim 9 wherein the ruthenium phosphorus alloy comprises 70 to 90 atomic percent ruthenium and 30 to 10 atomic percent phosphorus and wherein the ruthenium tungsten alloy comprises 70 to 90 atomic percent ruthenium and 30 to 10 atomic percent tungsten.

12. The method of claim 8 further comprising forming a barrier layer on the wall of the trench or via prior to forming a ruthenium-containing seed layer and wherein the ruthenium-containing seed layer is ruthenium and the ruthenium is formed on the barrier layer.

13. The method of claim 12 wherein the barrier layer is selected from the group consisting of tantalum and tantalum nitride.

14. The method of claim 8 further comprising forming a copper seed layer on the cobalt sacrificial layer and during the step of contacting, the copper plating solution dissolving the copper seed layer.

* * * * *